United States Patent [19]
Ohnuki et al.

[11] Patent Number: 5,554,960
[45] Date of Patent: Sep. 10, 1996

[54] BRANCHING FILTER, BRANCHING FILTER MODULE AND RADIO COMMNICATION APPARATUS

[75] Inventors: Hideo Ohnuki; Norio Hosaka; Hitoshi Watanabe, all of Yokohama; Isao Akitake, Chigasaki; Makoto Katagishi, Yokohama, all of Japan

[73] Assignee: Hitachi, Ltd., Tokyo, Japan

[21] Appl. No.: 385,649

[22] Filed: Feb. 8, 1995

[30] Foreign Application Priority Data

Feb. 10, 1994 [JP] Japan .................................. 6-016598

[51] Int. Cl.⁶ .................................................. H03H 7/46
[52] U.S. Cl. .......................... 333/132; 333/133; 333/202
[58] Field of Search ................................... 333/126, 132, 333/133, 202, 193–196, 128

[56] References Cited

U.S. PATENT DOCUMENTS

| | | | |
|---|---|---|---|
| 4,426,732 | 1/1984 | Mori | 333/193 |
| 4,758,922 | 7/1988 | Ishigahi et al. | 333/204 |
| 4,963,843 | 10/1990 | Peckham | 333/203 |
| 5,083,236 | 1/1992 | Chason et al. | 333/204 |
| 5,202,652 | 4/1993 | Tabuchi et al. | 333/193 |
| 5,323,127 | 6/1994 | Komazaki et al. | 333/132 |
| 5,438,305 | 8/1995 | Hikita et al. | 333/193 |

FOREIGN PATENT DOCUMENTS

| | | |
|---|---|---|
| 62-171327 | 7/1987 | Japan . |
| 0029109 | 1/1990 | Japan . |
| 5-7125 | 1/1993 | Japan . |
| 0575174 | 12/1993 | Japan . |
| 6-61782 | 3/1994 | Japan . |

*Primary Examiner*—Benny Lee
*Assistant Examiner*—Darius Gambino
*Attorney, Agent, or Firm*—Antonelli, Terry, Stout & Kraus

[57] ABSTRACT

A high-frequency apparatus usable as a branching filter, branching filter module and/or a radio communication apparatus. The high-frequency apparatus includes a conductor substrate, a first dielectric layer provided on the conductor substrate, a strip conductor provided on the first dielectric layer, and a second dielectric layer provided on the strip conductor and having through holes provided therein. At least one elastic surface-wave element is provided over the second dielectric layer in a position above the strip conductor and is connected to the strip conductor by the through holes.

23 Claims, 10 Drawing Sheets

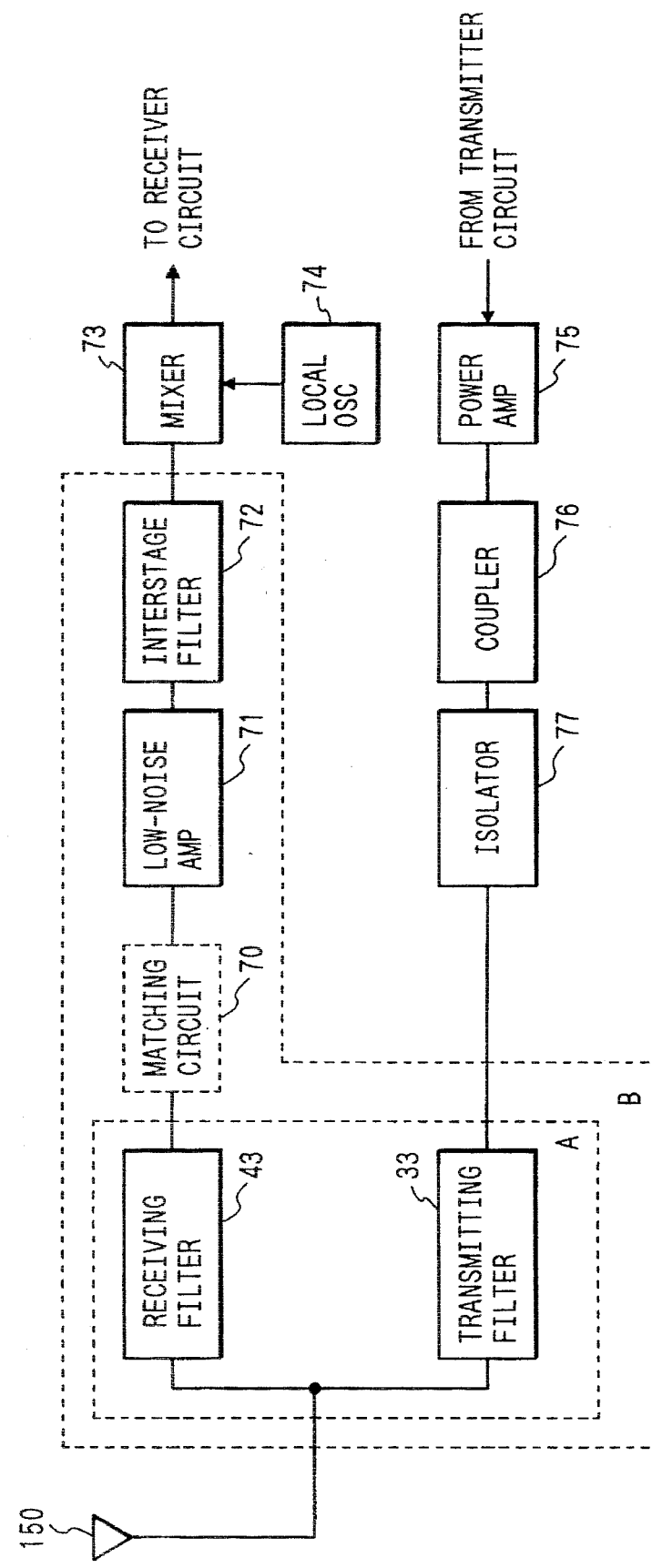

BRANCHING FILTER, BRANCHING FILTER MODULE AND RADIO COMMNICATION APPARATUS

BACKGROUND OF THE INVENTION

The present invention relates to a branching filter for achieving separation between a transmitting signal and a receiving signal, a branching filter module, and the like, which are mounted to different radio communication apparatus, each of which shares the use of a transmitting and receiving antenna, and to a radio communication apparatus using branching filter module and the like.

As an example illustrating the structure of a conventional branching filter, reference is made to Japanese Patent Application Laid-Open Publication No. 62-171327.

The branching filter is constructed in such a manner that different elements necessary for the formation of the branching filter, such as transmitting and receiving signal filters for effecting filtering processes on transmitting and receiving signals using desired pass-band characteristics, signal transmission lines (formed by patterning, for example), an amplifying device or element, an interstage filter, etc. are all provided on the same substrate (called support base). Thus, the conventional branching filter or branching filter module wherein all the necessary elements have been provided on the same substrate, has generally been widely used.

Also, there has been proposed a branching filter wherein a package is formed by multilayer alumina made of alumina used as a material and an elastic surface-wave filter having a piezoelectric substrate and cord-like electrodes provided on the piezoelectric substrate is provided within the package, a branching filter module, etc.

The prior art is accompanied by a problem that since a two-branch circuit (e.g., a two-branch strip line) is provided on a single-layer type dielectric substrate, it is difficult to stack other circuit on the two-branch circuit and a size reduction becomes disadvantageous. This is because a strip line having a stable line impedance cannot be formed unless a conductor plate is structurally provided on a two-branch circuit (corresponding to a strip conductor) with a dielectric layer interposed therebetween.

In the structure wherein the two-branch circuit is simply disposed on the single-layer type dielectric substrate, the two-branch circuit is not constructed in the form of a closed structure. It was therefore necessary to provide shields or the like to reduce external noise and stabilize the line impedance.

Now, the closed structure is equivalent to a structure shown in FIG. 11. Namely, it is necessary to stack a dielectric on a conductor substrate in a state in which a conductive strip conductor (e.g., a two-branch circuit) has been embedded in order to form a strip line having a stable line impedance. It is also necessary to stack a conductor plate on the dielectric. Such a structure will hereinafter be referred to as a "closed structure". It is of course unnecessary to make the area of the conductor plate shown in FIG. 11 identical to that of the conductor substrate. However, the strip conductor needs to have an area corresponding to an extent sufficient that the strip conductor is interposed between the conductor substrate and the conductor plate with the dielectric interposed therebetween.

Since it is necessary to provide the conductor plate in this manner, the degree of freedom of laying out other circuit elements provided on the conductor substrate is limited.

It is also necessary to take into consideration impedance matching when it is desired to use a filter. It is therefore necessary to provided a matching circuit. However, the simple provision of the matching circuit on the support base makes it more difficult to reduce a size of a branching filter.

These problems can be solved more or less in the case of a branching filter using the aforementioned multilayer alumina. However, a problem still remains that the transmission loss of the two-branch circuit increases due to the difficulty of fabricating a multilayer alumina substrate and restrictions on characteristics of materials.

SUMMARY OF THE INVENTION

It is therefore an object of the present invention to provide a branching filter which is small in size and high in performance (corresponding to performance such as a reduction in transmission loss at a high-frequency domain).

It is another object of the present invention to provide different radio apparatus, each using a branching filter, which can be reduced in size and weight.

In accordance with the present invention, there is provided a branching filter which comprises a conductor substrate, a first dielectric layer provided on the conductor substrate, a strip conductor provided on the first dielectric substrate, a second dielectric layer provided on the strip conductor and having a plurality of through holes defined therein, and at least one elastic surface-wave filter provided on the second dielectric layer so as to be located in a position above the strip conductor, and the elastic surface-wave filter being connected to branches of the strip conductor by the through holes.

According to features of the present invention, the strip conductor is a two-branch strip line conductor having transmitting and receiving terminals to which devices including an antenna are connectable and transmitting and receiving elastic surface-wave filters are provided on the second dielectric layer which has a conductor member for forming a strip line.

Accordingly, the second dielectric layer has a terminal for inputting a transmitting signal received by the transmitting elastic surface-wave filter, a terminal for outputting a filtering signal from the transmitting elastic surface-wave filter, a terminal for inputting a transmitting signal received by the receiving elastic surface-wave filter and a terminal for outputting a filtering signal from the receiving elastic surface-wave filter, all of which are provided on the second dielectric layer.

Preferably, each of the elastic surface-wave filters is comprised of a plurality of elastic surface-wave resonators formed on a piezoelectric substrate and spiral coils formed on a substrate different from the piezoelectric substrate and is constructed such that the elastic surface-wave resonators are respectively electrically connected to the spiral coils.

In accordance with the present invention, a branching filter module can also be constructed wherein at least any of circuits including a matching circuit, an amplifying circuit and an interstage filter is provided on the second dielectric layer so as to be connected to at least one terminal of at least one elastic surface-wave filter.

Further, a branching filter module is also considered wherein the area of the first dielectric layer is made greater, and a two-branch strip line conductor and at least any of circuits including a matching circuit, an amplifying circuit and an interstage filter are provided on the first dielectric layer. Incidentally, a radio communication apparatus using the branching filter or the branching filter module referred to above is also considered.

According to the present invention as described above, a two-branch strip line is disposed in an intermediate position of a multilayer dielectric comprised of a plurality of layers and a receiving elastic surface-wave filter and a transmitting elastic surface-wave filter are provided on the uppermost layer of the multilayer dielectric in order to achieve the above object. Further, the receiving elastic surface-wave filter and the transmitting elastic surface-wave filter are connected to their corresponding branches of the two-branch strip line by way of formed through holes.

Incidentally, each of the through holes is shaped in the form of a semicircular groove as indicated by X in FIG. 1(b) and is coated with a conductive material. It is needless to say that a circular through-hole is also used as an alternative to the semicircular groove. Such semicircular grooves as indicated by A in FIG. 1(b), which are employed in the accompanying drawings of the present application, are all through holes. Desired elements are electrically connected to one another by the through holes referred to above.

As an elastic surface-wave filter, one disclosed in Japanese Patent Application Laid-Open Publication No. 5-7125 or Japanese Patent Application Publication No. 4-211201, for example may preferably be used wherein a plurality of surface-wave resonators provided on a piezoelectric substrate and spiral coils formed on a substrate different from the piezoelectric substrate by conductor patterns are connected to one another by harnesses. Of course, different devices such as a stub, an amplifier, other filters, etc. can also be provided on a multilayer dielectric. A branching filter formed in this way can be easily applied to different radio communication apparatus.

According to the present invention, a branching filter having the above construction, different parts can be provided on the outermost layer (e.g., the uppermost layer) of the multilayer dielectric because the two-branch strip line is disposed in the intermediate position of the multilayer dielectric. Namely, the two-branch strip line is first constructed such that since a dielectric layer and an earth or ground conductor may exist on upper and lower sides of a strip conductor with the strip conductor as the center, the conductor is disposed through the dielectric layer to ensure a closed structure formed in this manner. Next, various parts, circuit elements, etc. can be mounted within a space other than a space occupied by the ground conductor provided to form the closed structure in the dielectric layer stacked on the strip conductor. Alternatively, a dielectric layer and a conductor layer are further provided on an external portion (an upper portion, for example) of a ground conductor layer provided on a strip conductor with the dielectric layer interposed therebetween. In doing so, the dielectric layer can be used for disposing various circuit wiring patterns and a microstrip line thereon.

Since the elastic surface-wave filter formed by connecting necessary portions of a plurality of surface-wave resonators provided on a piezoelectric substrate and spiral coils formed on a different substrate by conductive patterns and to one another, is used as the elastic surface-wave filter, it is unnecessary to provide a matching circuit. Thus, the branching filter can be further reduced in size.

The length of a normal two-branch strip line requires a length corresponding to one-fourth of a wavelength I of an electromagnetic wave defined by a dielectric constant of a dielectric substrate to be used and a frequency to be used.

Since, however, the surface-wave filter has a line length of I/8 or so within a frequency band necessary for branching, the length of the two-branch strip line can be reduced to about half the normal length. This can also provide a further size reduction in the branching filter.

Different elements such as a stub, an amplifying circuit, an interstage filter, etc. can be provided on the outermost layer. This also provides a further size reduction in the branching filter. Furthermore, circuit elements such as an amplifying circuit, etc. can be provided on a layer identical to a dielectric layer on which a two-branch strip line is disposed. Since noise inputted to the circuits can be reduced in this case, a circuit system capable of reducing a noise factor can be constructed.

Since the surface area of the multilayer dielectric employed in the present invention is sufficient so far as such a surface area that the two-branch strip line can be formed, is allowed, a large surface area is not particularly required. Thus, even if a high-frequency substrate (which is excellent in transmission characteristics within a high-frequency band, for example), which is higher in price than a general-purpose substrate, for example, is used, a branching filter reduced in transmission loss can be realized without an abrupt increase in cost.

Other and further objects and features of the invention will appear fully from the following description.

BRIEF DESCRIPTION OF THE DRAWINGS

FIG. 7 is a block diagram circuit arrangement of a high-frequency section of a mobile radio apparatus.

DESCRIPTION OF THE PREFERRED EMBODIMENTS

Figure 1A:
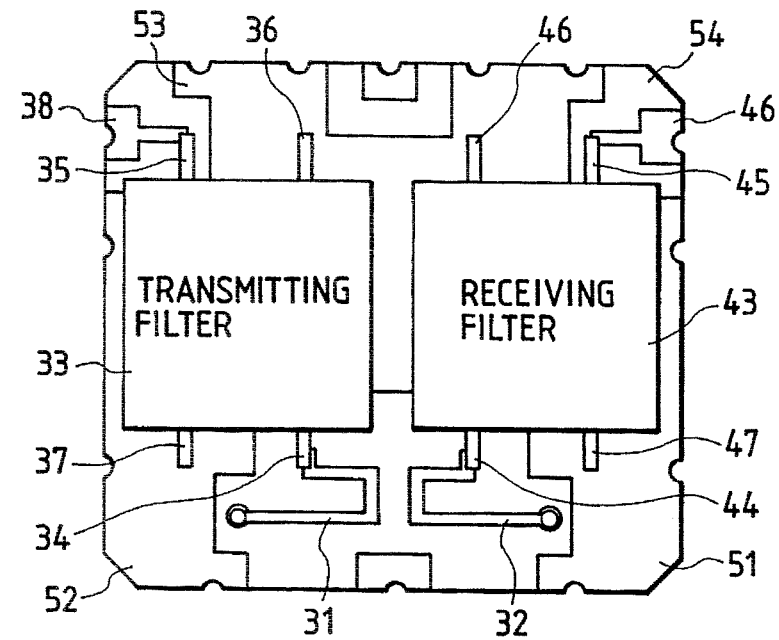
FIGS. 1(a)–1(c) are views showing the structure of an embodiment according to the present invention.
Figure 1B:
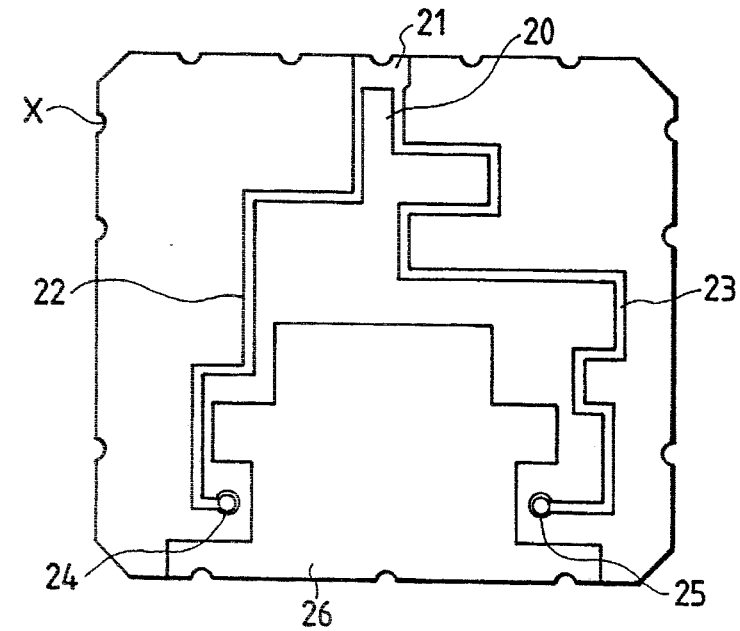
Figure 1C:
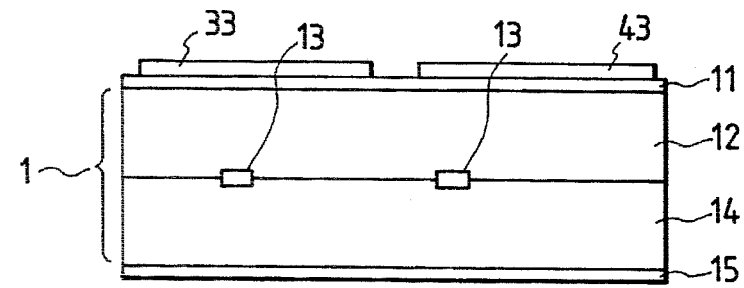

Preferred embodiments of the present invention will hereinafter be described with reference to the accompanying drawings, wherein like reference numerals are utilized to designate like parts throughout the views and FIG. 1(a) is a top view showing the structure of an embodiment of the present invention. FIG. 1(b) is a pattern view illustrating the structure of a two-branch strip line which is employed in the present embodiment and provided at the midpoint position (corresponding to the position where two dielectric layers are joined to each other, which will hereinafter be referred to as the "midpoint portion" of a multilayer dielectric 1 (i.e., a view illustrating the manner in which a two-branch strip line is provided on a dielectric layer 14). FIG. 1(c) is an enlarged view of a partial section (which corresponds to a cross section taken along an imaginary cutting plane line parallel to a line which crosses over transmitting and receiving filters 33 and 43, respectively, shown in FIG. 1(a)) for describing the structure of the multilayer dielectric 1 employed in the present embodiment.

The present embodiment represents a branching filter indicated by broken line block A in FIG. 7 which is a block diagram circuit arrangement of a high-frequency section of a normal radio apparatus (such as a mobile radio apparatus in particular). A signal received by an antenna 150 in the radio apparatus shown in FIG. 7 is first subjected to a filtering process (for reducing or attenuating the level of a signal having a frequency which lies outside a necessary frequency band) by the receiving filter 43. The received signal is next amplified at a predetermined amplification factor by a low-noise amplifier 71 comprised of electronic devices such as an HEMT, an FET, etc. Thereafter, the so-amplified signal is supplied to a mixer 73 through an interstage filter 72 for effecting a further filtering process. On the other hand, an oscillating output (corresponding to a frequency of an intermediate frequency signal to be described later, which is equivalent to a difference between a frequency of the oscillating output signal and a frequency of the received signal) generated from a local oscillator 74 is inputted to a mixer. The mixer is activated so as to convert the received signal into the so-called intermediate frequency signal, after which the converted signal is inputted to an unillustrated receiver circuit so as to obtain predetermined received information. A matching circuit 70 as shown in broken line may be provided at the output of the receiving filter 43.

When a signal is transmitted from a transmitting circuit, the transmitted signal is amplified by a power amplifier comprised of FETs or passive circuit elements for activating the FETs and the like. Thereafter, the amplified signal is inputted to an isolator 77 through a coupler 76. Further, the signal is subjected to a filtering process by the receiving filter 33 without generating a reflected wave traveling toward a transmitter source. Thereafter, the so-processed signal is transmitted to other receiver apparatus through the antenna 150. Thus, the present system provides a radio apparatus wherein a desired signal is transmitted therefrom and received therein under a structure in which the antenna is common to transmission and reception, the filters are provided so as to correspond to the transmitting signal and the receiving signal. The coupler 76 has a microstrip line and passive circuit elements. Further, the coupler is used for detecting the level of the transmitting signal but does not necessarily represent an essential component. The isolator serves as a high-frequency device comprised of ferrite, for example. The isolator has a function for transmitting a signal in one direction so as to avoid the reflection of the signal but is not always an essential component.

The multilayer dielectric 1 employed in the present embodiment is shown in FIG. 1(c) and is constructed such that the dielectric layer 14 is fabricated on a conductor substrate 15 and a dielectric layer 12 is formed on the dielectric layer 14. At this time, patterns such as a two-branch strip line 20, etc. are provided on the dielectric layer 14 as shown in FIG. 1(b). A portion on which the patterns such as the two-branch strip line 20, etc. are provided, will be referred to as a conductor layer 13 for convenience of illustration and description. Devices such as a transmitting filter 33, a receiving filter 43, etc. are fabricated on the dielectric layer 12 as shown in FIG. 1(a). A portion on which the devices such as the transmitting filter 33, the receiving filter 43, etc. are provided, will be referred to as a conductor layer 11 for convenience of illustration and description. An organic material such as a glass-cloth base epoxy resin or the like is used as the dielectric layer and copper may preferably be used as a material of a conductor to be used.

The two-branch strip line 20 is patterned onto the conductor layer 13 provided so as to correspond to the intermediate position of the multilayer dielectric layer 1 as shown in FIG. 1(b). Fabrication of such a pattern utilizes known techniques such as etching or the like and description of a method of producing the various patterns which are employed in the present specification will therefore be omitted.

The two-branch strip line 20, as shown in FIG. 1(b), has a conductive external terminal 21 and two strip lines 22 and 23. Ends 24 and 25 of the strip lines 22 and 23 formed therein are provided so as to extend through the dielectric layer 12 of the multilayer dielectric 1. The ends 24 and 25 are respectively electrically connected to lines 31 and 32 patterned onto the conductor layer 11 by through holes. A ground or earth electrode pattern 26 is provided on the conductor layer 13. The earth electrode pattern 26 is electrically connected to earth electrodes of the conductor layer 11 and the conductor substrate 15 through the through holes. As has been described previously, all the semicircular grooves corresponding to X portions shown in FIG. 1(b) represent the through holes in the drawing.

As shown in FIG. 1(a), the line 31 provided on the dielectric layer 12 is electrically connected to an output terminal 34 of a transmitting filter 33, whereas the line 32 is electrically connected to an input terminal 44 of a receiving filter 43. Further, an input terminal 33 of the transmitting filter 35 is electrically connected to a conductive external terminal 38, whereas an output terminal 45 of the receiving filter 43 is electrically connected to a conductive external terminal 48. The remaining terminals 36, 37, 46 and 47 of the transmitting and receiving filters 33 and 43 are earth or ground terminals and are respectively electrically connected to ground electrodes 51, 52, 53 and 54 provided on the dielectric layer 12. The ground electrodes 51, 52, 53 and 54 are respectively electrically connected to the ground electrodes of the conductor layer 13 and the conductor substrate 15 by way of the through holes. Thus, a closed structure can be ensured.

The dielectric layers 12 and 14 of the multilayer dielectric 1 can be fabricated by using a so-called copper-clad laminated plate or a prepreg obtained by impregnating a glass fiber with an organic material such as an epoxy resin or the like and bonding the impregnated glass fiber and a thin copper plate to each other in accordance with a step similar to a step of fabricating a normal printed circuit board. Organic materials having excellent high-frequency characteristics have been developed in recent years. If these are used, then a branching filter can be fabricated which is capable of providing less propagation losses even in the case of a high-frequency domain. Further, the multilayer dielectric 1 can be fabricated in the same manner as described above even when a non-organic material such as glass ceramic or the like to which low-temperature sintering can be made, is used.

As the transmitting filter 33 and the receiving filter 43 employed in the present embodiment, elastic surface-wave filters disclosed in Japanese Patent Application Laid-Open Publication No. 5-7125 and Japanese Patent Application Publication No. 4-211201, for example, may preferably be used, each of which has a plurality of surface-wave resonators provided on a piezoelectric substrate and spiral coils formed on a substrate different from the piezoelectric substrate in the form of conductor patterns and each of which is constructed such that the surface-wave resonators are connected to the spiral coils with harnesses. So long as a filter having a function of filtering a transmitting signal and a received signal is used, i.e., a filter actually mountable on the dielectric layer 12 is used, any type of filter may be used. For example, an IDT type resonator on which cord-like electrodes are arranged and formed, may be used. The piezoelectric substrate or the substrate having the spiral coils formed thereon may be provided on the dielectric layer 12 so as to form an elastic surface-wave filter. It is apparent that a package including packaged elastic surface-wave filter elements therein may be provided on a desired position of the dielectric layer 12.

The operation of the embodiment of FIGS. 1(a)–1(c) which serve as the branching filter, will now be described. For example, a signal transmitted from a transmitter circuit is inputted to the transmitting filter 33 through the external terminal 38 and the input terminal 35 of the transmitting filter 33, which is electrically connected to the external terminal 38. When the transmitted signal is inputted to the transmitting filter 33, the transmitting filter 33 effects a filtering process on the transmitted signal using its filter characteristics and outputs the so-processed signal to the output terminal 34 of the transmitting filter 33. The output signal passes through the line 31 and the strip line 22 so as to be sent to the outer terminal 21. An antenna (not shown) is normally connected to the external terminal 21 and transmits or radiates the transmitting signal into space. It is necessary to match impedances of respective components to each other in order to reduce a transmission loss of the transmitting signal. Therefore, when the matching impedance of the antenna is taken as 50Ω, for example, the impedance of the strip line 22, the impedance of the line 31 and the output impedance of the transmitting filter 33 are all set to a value approximate to 50Ω within a frequency band of the transmitting signal.

Since the strip line 23 provided on the receiving side is electrically connected to the external terminal 21, it is necessary to sufficiently increase the impedance of the strip line 23 within the frequency band of the transmitting signal when the strip line 23 is seen from the external terminal 21 and to reverse the phase of a reflected wave. Therefore, the phase of an input impedance of the receiving filter 43 may be taken into consideration. Further, the lengths of the receiving strip lines 23 and 32 may be set so that the reflected wave is reversed in phase when the receiving strip line 23 is seen from the external terminal 21.

A signal to be received, which is transmitted from an outer communication apparatus or the like, is inputted to the external terminal 21 through the unillustrated antenna. Thereafter, the signal is transmitted along the end 25 of the strip line 23 and the line 32 so as to be input to the input terminal 44 of the receiving filter 43. The signal, which has been subjected to a filtering process of the receiving filter 43, is outputted from the output terminal 45 of the receiving filter 43 so as to be transmitted to the external terminal 48. The low-noise amplifying circuit 71 shown in FIG. 7, for example, is electrically connected to the external terminal 48.

Incidentally, the antenna (not shown) is electrically connected to the external terminal 21 as described above. However, various types of antennas such as a rod type antenna, a microstrip type antenna, etc. are considered as antennas. In this case, antennas of any type may be used if they have functions for transmitting and receiving an electromagnetic wave.

It is necessary to make the impedance matching between the respective components in order to reduce the transmission loss of the received signal. Therefore, when the matching impedance of the antenna is taken as 50Ω, for example, the impedance of the strip line 23, the impedance of the line 32 and the input impedance of the receiving filter 43 are all set to a value approximate to 50Ω within a frequency band of the received signal.

Since the strip line 22 provided on the transmitting side is also electrically connected to the external terminal 21, it is necessary to sufficiently increase the impedance of the strip line 22 within the frequency band of the received signal when the strip line 22 is seen from the external terminal 21 and to reverse the phase of a reflected wave. Therefore, the phase of an output impedance of the transmitting filter 23 may be taken into consideration. Further, the lengths of the strip lines 22 and 31 may be set so that the reflected wave is reversed in phase when the strip line 22 on the transmitting side is seen from the external terminal 21.

According to the present embodiment as described above, since the two-branch strip line 20 comprised of the external terminal 21 and the two strip lines 22 and 23, and the receiving filter 43 and the transmitting filter 33 can be provided in a stacked state with the dielectric layer interposed therebetween, necessary elements can be disposed within a narrow space, thereby making it possible to realize a branching filter which is extremely small in size. Further, since the two-branch strip line 20 is interposed between the ground electrode formed on the dielectric layer 12 and the conductor substrate 15 (having a function of the ground electrode), it is easy to ensure a closed structure having a stable line impedance. Further, the two-branch strip line 20 is formed so as to have a structure which is substantially insusceptible to the influence of external noise. It is thus possible to realize a branching filter whose insertion loss is low and which is increased in performance and is extremely small in size.

Another embodiment according to the present invention is illustrated in FIGS. 2(a)–2(d) and shows a structure in which, for example, a receiving filter and a transmitting filter are packaged within the same package.

It is noted that FIGS. 1(a)–1(c) show a structure wherein the receiving filter and the transmitting filter are provided in a separate manner.

Figure 2A:
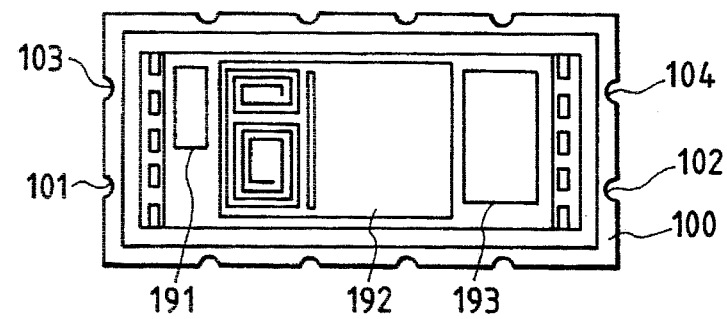
FIGS. 2(a)–2(d) are views illustrating the structure of another embodiment according to the present invention.
Figure 2B:
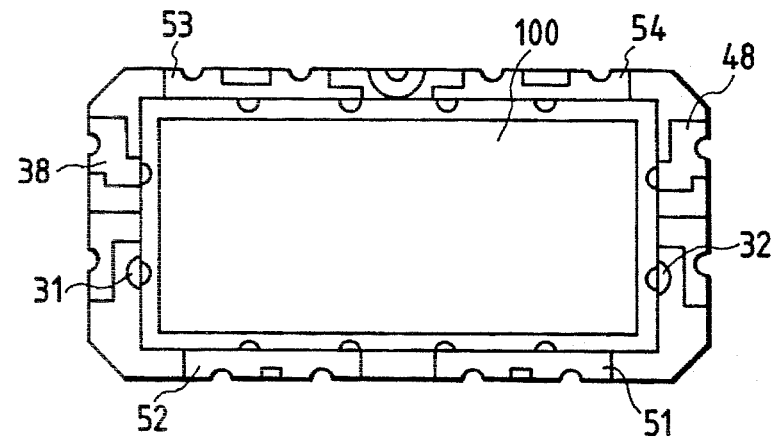
Figure 2C:
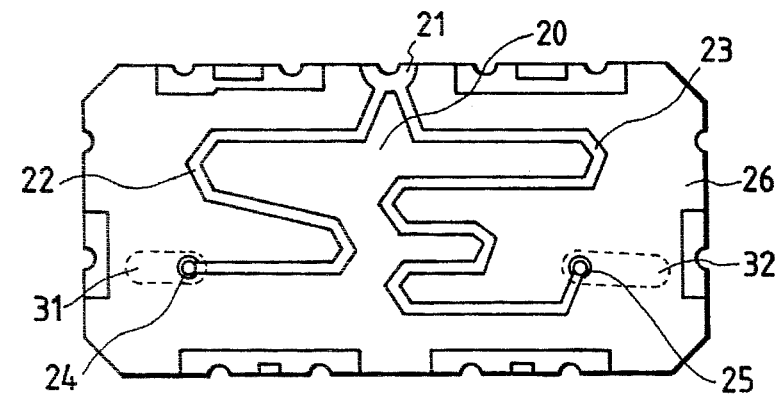
Figure 2D:
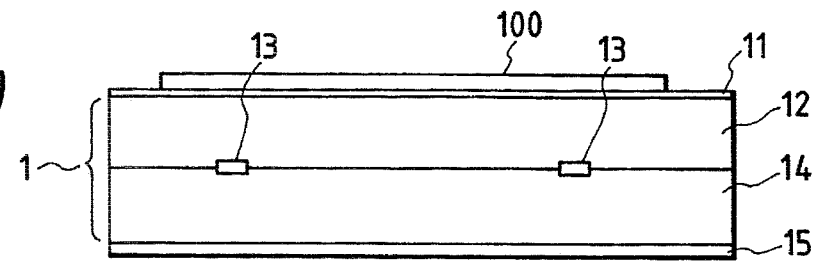

FIG. 2(a) is a view schematically showing the inside of a transmitting and receiving filter 100 employed in the present embodiment. FIG. 2(b) is a top view showing the structure according to the second embodiment of the present invention as seen from above. FIG. 2(c) is a pattern view of a two-branch strip line provided at an intermediate or midportion portion of a multilayer dielectric 1 employed in the present embodiment. FIG. 2(d) is an enlarged view of a partial section (i.e., a cross section taken along a single imaginary cutting plane line which crosses over the longitudinal direction of the transmitting and receiving filter shown in FIG. 2(b)) for describing the structure of the multilayer dielectric 1 employed in the present embodiment.

As the transmitting and receiving filter 100 shown in FIG. 2(a), which is employed in the present embodiment, there may be used a filter disclosed in Japanese Patent Application Publication No. 5-7125 or Japanese Patent Application Publication No. 4-211201, for example. Namely, as described above, a surface filer is used which has the plurality of surface-wave resonators provided on the piezoelectric substrate and the spiral coils formed on the substrate different from the piezoelectric substrate in the form of the conductor patterns and which is constructed such that the surface-wave resonators are connected to the spiral coils. It is apparent that the filter which is to be used is not necessarily limited to the above structure. That is, a normal filter may be used which is constructed such that necessary electrode patterns including various cord-like electrodes are provided on a piezoelectric substrate such as ceramic or the like.

FIG. 2(a) is a schematic view typically showing the inside of the transmitting and receiving filter 100 with detailed structures of a bonding wire and the like being omitted. The transmitting and receiving filter 100 has a transmitting SAW (elastic surface wave) resonator substrate 191, a coil substrate 192 and a receiving SAW resonator substrate 193 all provided thereinside. Each of these substrates is made up of a piezoelectric material such as ceramic or the like. Further, desired electrode patterns are formed on these substrates. It is unnecessary to form the coil substrate 192 with the piezoelectric material. An electrode pattern is spirally formed on the coil substrate 192. Necessary patterns including electrode patterns for forming resonators are provided on the transmitting SAW resonator substrate 191 and the receiving SAW resonator substrate 193. The filter is actually constructed by wire-connection between respective SAW resonators on the SAW resonator substrates and respective coils on the coil substrate 192 by wire bonding. However, the transmitting and receiving filter 100 is shown in a state in which the details of such wiring and the like have been omitted. Incidentally, only the electrode patterns of the coils have been typically illustrated in the drawing. Since detailed structures of such electrode patterns are known, the detailed description is omitted. As an alternative to the structure in which the package having the receiving filter and the transmitting filter packaged therein is provided on the dielectric layer 12, a structure in which the receiving filter and the transmitting filter are directly provided on the dielectric layer 12 may also be considered.

The multilayer dielectric 1 employed in the present embodiment is shown in FIG. 2(d) and is constructed such that a dielectric layer 14 is fabricated on a conductor substrate 15 and a dielectric layer 12 is formed on the dielectric layer 14. At this time, patterns such as a two-branch strip line 20, etc. shown in FIG. 1(c) are provided on the dielectric layer 14. A portion on which the patterns such as the two-branch strip line 20, etc. are provided, will be referred to as a conductor layer 13 for convenience of illustration and description. Devices such as the transmitting and receiving filter 100, etc. are fabricated on the dielectric layer 12 as shown in FIG. 2(a). A portion on which the devices such as the transmitting and receiving filter, etc. are provided, will be referred to as a conductor layer 11 for convenience of illustration and description. A glass organic material such as a glass-cloth base epoxy resin or the like is used as the dielectric layer and copper is considered as a material of a conductor to be used.

The two-branch strip line 20 is patterned onto the conductor layer 13 which exists in the intermediate or midpoint position of the multilayer dielectric layer 1 as shown in FIG. 2(c). Namely, the patterns such as the two-branch strip line 20, etc. shown in FIG. 2(c) are provided on the dielectric layer 14. The two-branch strip line 20 has a conductive external terminal 21 and two strip lines 22 and 23. Ends 24 and 25 of the strip lines 22 and 23 are electrically connected to patterns 31 and 32 of the conductor layer 11 by way of through holes provided so as to extend through the dielectric layer 12 of the multilayer dielectric 1.

As shown in FIG. 2(b), a pattern 31 of the conductor layer 11 of the multilayer dielectric 1 is electrically connected to a transmitting signal output terminal 101 (FIG. 2(a)) attached to the transmitting and receiving filter 100, whereas a pattern 32 thereof is electrically connected to a receiving signal input terminal 102 (FIG. 2(a)) attached to the transmitting and receiving filter 100. A transmitting signal input terminal 103 (FIG. 2(a)) of the transmitting and receiving filter 100 is electrically connected to a conductive external terminal 38, whereas a received-signal output terminal 104 (FIG. 2(a)) is electrically connected to a conductive external terminal 48. The remaining terminals of the transmitting and receiving filter 100 are of earth or ground terminals and are respectively electrically connected to ground electrodes 51, 52, 53 and 54 provided on the conductor layer 11. Further, the ground electrodes 51, 52, 53 and 54 are respectively electrically connected to ground electrodes formed in the conductor layer 13 and the conductive layer 15 by way of through holes defined in the transmitting and receiving filter 100. A so-called closed structure is ensured by these ground electrodes.

The operation of the embodiment of FIGS. 2(a)–2(d) which serves as a branching filter will now be described. For example, a signal transmitted from a transmitter circuit is inputted to the transmitting and receiving filter 100 through the external terminal 38 and the transmitting signal input terminal 103 of the transmitting and receiving filter 100 connected to the external terminal 38. When the transmitted signal is inputted to the transmitting and receiving filter 100, the transmitting and receiving filter 100 effects a filtering process on the transmitted signal based on its filter characteristics and outputs the so-processed signal to the transmitting signal output terminal 101 of the transmitting and receiving filter 100. The output signal passes through the pattern 31 and the strip line 22 so as to be sent to the outer terminal 21. An antenna (not shown) is normally connected to the external terminal 21 and the transmitting signal is radiated into the space through the antenna.

Further, a signal to be received, which is transmitted from an outer communication apparatus or the like, is inputted to the external terminal 21 through the unillustrated antenna. Thereafter, the signal passes through the end 25 of the strip line 23 and the pattern 32 so as to be input to the receiving signal input terminal 102 of the transmitting and receiving filter 100. The signal, which has been subjected to the filtering process of the transmitting and receiving filter 100, is outputted from the received-signal output terminal 104 of the transmitting and receiving filter 100 so as to be transmitted to the external terminal 48.

According to the present embodiment as has been described above, since the multilayer dielectric 1 having a size substantially identical to that of the package for the transmitting and receiving filter 100 can be used, the branching filter itself can be reduced in size. The package for the transmitting and receiving filter to be used is used as a single unit and hence the branching filter reduced in cost can be structurally realized.

Figure 3A:
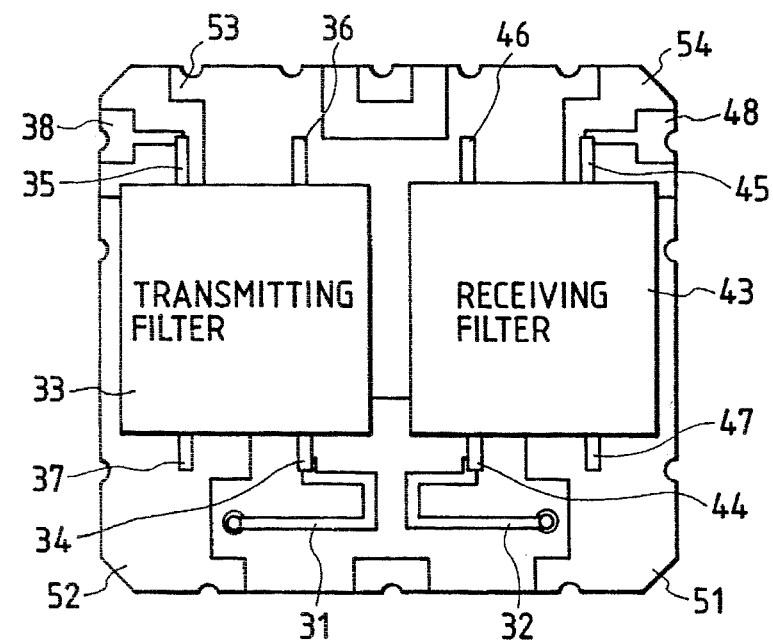
FIGS. 3(a)–3(c) are views depicting the structure of a further embodiment according to the present invention.
Figure 3B:
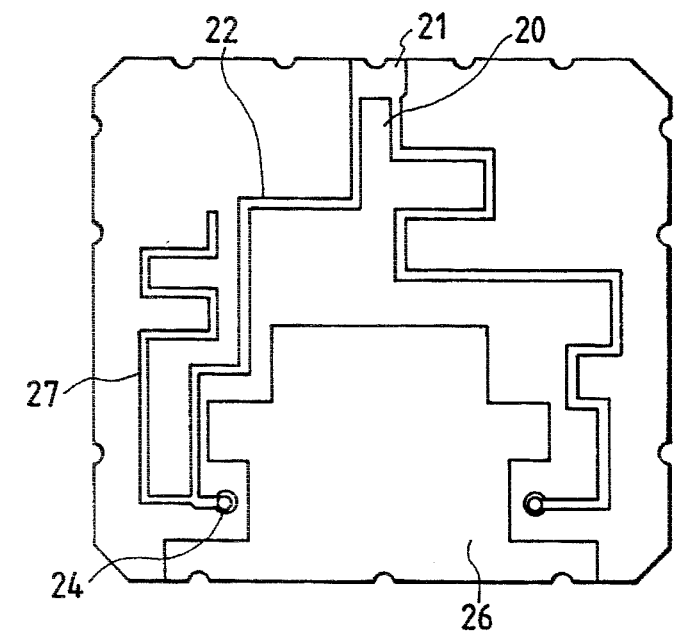
Figure 3C:
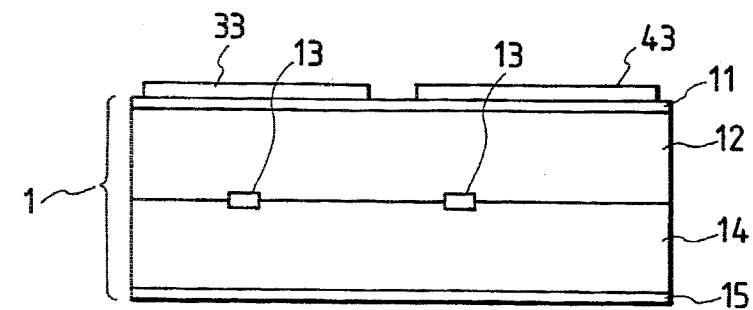

A third embodiment according to the present invention is illustrated in FIGS. 3(a)–3(c), wherein FIG. 3(a) is a top view showing the state of a structure of the third embodiment as seen from the upper side. FIG. 3(b) is a pattern view showing a two-branch strip line (which is provided on a dielectric layer 14) provided at an intermediate or midportion portion of a multilayer dielectric 1 employed in the present embodiment and an open stub. FIG. 3(c) is an enlarged view of a partial section (which corresponds to a cross section taken along a single imaginary cutting plane line which crosses over transmitting and receiving filters shown in FIG. 3(a)) for describing the structure of the multilayer dielectric 1 employed in the present embodiment.

The present embodiment is substantially identical in structure to the first embodiment shown in FIGS. 1(a)–1(c). As shown in FIG. 3(b), a two-branch strip line 20 and an open stub 27 are patterned onto a conductor layer 13 (i.e., a dielectric layer 14) which exists in the intermediate position of the multilayer dielectric 1. The open stub 27 is disposed in the neighborhood of an end 24 of a strip line 22 although the open stub 27 is not necessarily provided in the neighborhood of the end 24. Further, the open stub 27 is electrically connected to the end 24.

According to the present embodiment, since an attenuation electrode can be formed by the open stub 27, the structure of a transmitting filter 33 can be simplified. Since the open stub 27 can be disposed within the remaining empty space on the dielectric layer 14 other than a space in which the two-branch strip line 20 has been disposed, a branching filter can be constructed so as to have the open stub 27 without increasing its size. By setting the line width and length of the open stub 27 to suitable values, the impedance of the strip line 22 can be set to a desired value. Therefore, a further reduction in the impedance mismatch can be effected. The manner of transmitting the signals to be transmitted and received in the branching filter is identical to that shown in FIGS. 1(a)–1(c) and the description of common portions are therefore omitted.

A fourth embodiment according to the present invention will now be described with reference to FIGS. 4(a)–4(c) and the circuit configuration is represented by the broken line block B shown in FIG. 7, of a high-frequency section of the normal mobile radio apparatus, and which is realized as a branching filter module.

Figure 4A:
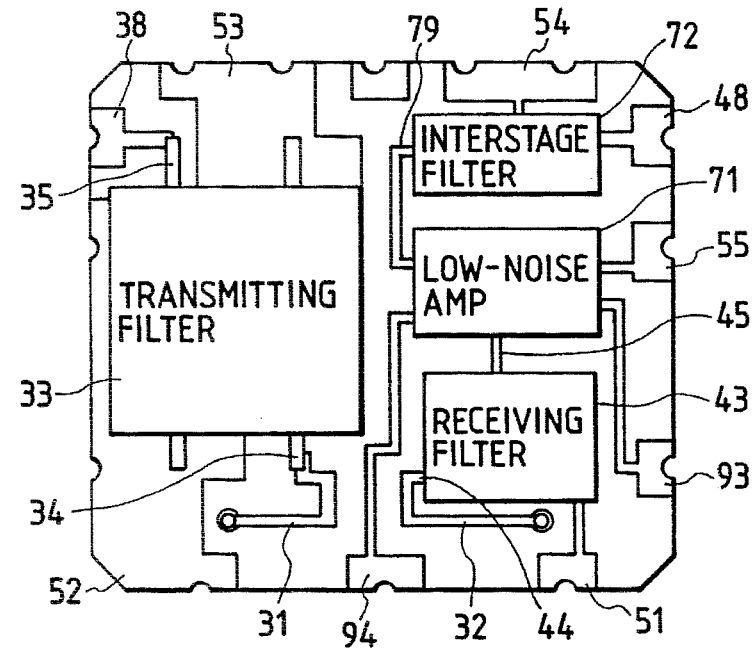
FIGS. 4(a)–4(c) are views showing the structure of a still further embodiment according to the present invention.

FIG. 4(a) is a top view showing the state of a structure of the present embodiment as seen from above. FIG. 4(b) is a pattern view of a two-branch strip line and an open stub both provided at an intermediate portion of a multilayer dielectric 2 employed in the present embodiment (i.e., FIG. 4(b) shows the manner of provision of the two-branch strip line on a dielectric layer 14). FIG. 4(c) is an enlarged view of a partial section (which corresponds to a cross section taken along a single imaginary cutting plane line which crosses over transmitting and receiving filters shown in FIG. 4(a)) for describing the structure of the multilayer dielectric 2 employed in the present embodiment.

Figure 4B:
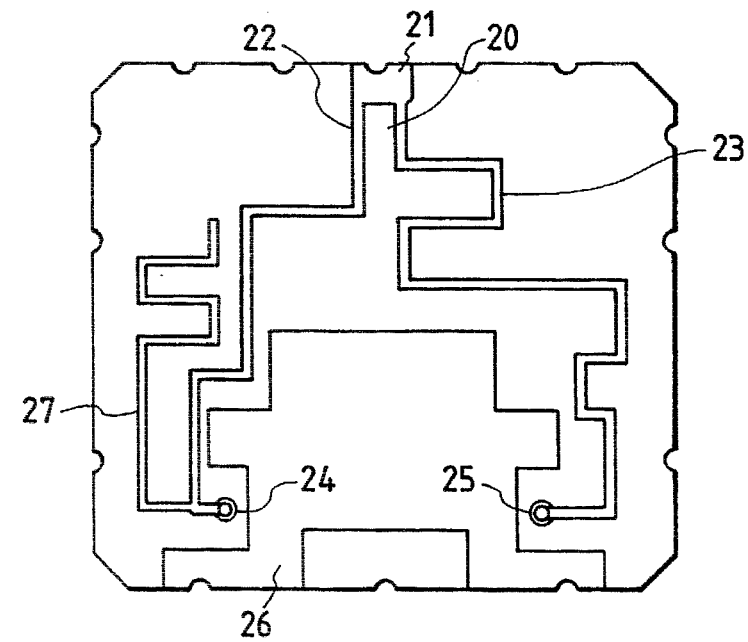
Figure 4C:
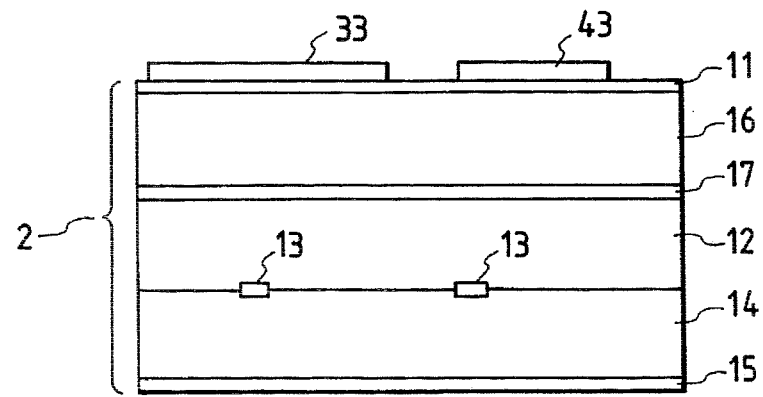

The present embodiment is substantially identical in structure to the third embodiment shown in FIGS. 3(a)–3(c) with the multilayer dielectric 2 shown in FIG. 4(c) being used in the present embodiment. The multilayer dielectric 2 is constructed such that a dielectric layer 14 is fabricated on a conductor substrate 15 and a dielectric layer 12 is formed on the dielectric layer 14. At this time, patterns such as a two-branch strip line 20, etc. shown in FIG. 4(b) are provided on the dielectric layer 14. A portion on which the patterns such as the two-branch strip line 20, etc. are provided, will be referred to as a conductor layer 13 for convenience of illustration and description. A conductor layer 17 (i.e., a flat conductor plate with no circuit elements or the like provided thereon in particular) is provided on the dielectric layer 12 and a dielectric layer 16 is stacked on the conductor layer 17. Devices such as a transmitting filter, a receiving filter, etc. shown in FIG. 4(a) are fabricated on the dielectric layer 16. A portion on which the devices such as the transmitting and receiving filters, etc. are provided, will be referred to as a conductor layer 11 for convenience of illustration and description. An organic material such as a glass-cloth base epoxy resin or the like is used as the dielectric layer and copper is considered as a material of a conductor to be used. The conductor layer 17 is comprised of the flat conductor plate provided just in layer form and is not provided with various elements in particular.

As shown in FIG. 4(c), the two-branch strip line 20 and the open stub 27 are patterned onto the conductor layer 13 which exists in the intermediate position of the multilayer dielectric 2 as shown in FIG. 4(b). Namely, the two-branch strip line 20 and the open stub 27 are provided on the dielectric layer 14. The two-branch strip line 20 is constructed so as to have an external terminal 21 and two strip lines 22 and 23. Ends 24 and 25 of the strip lines 22 and 23 are respectively electrically connected to lines 31 and 32 patterned onto the conductor layer 11 by way of through holes defined so as to extend through the dielectric layer 12 and the dielectric layer 16.

As shown in FIG. 4(b), an earth or ground electrode pattern 26 is formed on the dielectric layer 14. The earth electrode pattern 26 is electrically connected to earth or ground electrodes provided for the conductor layer 11, the conductor substrate 15 and the conductor layer 17 by way of through holes.

As shown in FIG. 4(a), the line 31 patterned on the conductor layer 11 is electrically connected to an output terminal 34 of a transmitting filter 33, whereas the line 32 is electrically connected to an input terminal 44 of a receiving filter 43. An input terminal 35 of the transmitting filter 33 is electrically connected to a conductive external terminal 38. On the other hand, the receiving filter 43 and the low-noise amplifier 71 are electrically connected to each other through a line 45 so that a signal outputted from the receiving filter 43 is supplied to the low-noise amplifier 60 as an input signal. Further, the low-noise amplifier 71 and the receiving interstage filter 72 are electrically connected to each other through a line 79 so that a signal outputted from the low-noise amplifier 71 is supplied to the receiving interstage filter 72 as an input signal. An output terminal of the receiving interstage filter 72 is electrically connected to an external terminal 48.

External terminals 93 an 94 serve as power terminals of the low-noise amplifier 71. The remaining lines electrically connected to the transmitting filter 33, the interstage filter 72, the low-noise amplifier 71 and the receiving filter 43 are used as earth or ground lines, which are respectively electrically connected to ground or earth electrodes 51, 52, 53, 54 and 55 of the conductor layer 11. Further, the earth electrodes 51, 52, 53, 54 and 55 are electrically connected to ground or earth electrodes of the conductor layer 13, the conductor substrate 15 and the conductor layer 17 (the latter two of which are conductor plates corresponding to earth electrodes) by way of through holes. Further, a closed structure of the two-branch strip line 20 is ensured by the conductor substrate 15, the dielectric layers 14 and 12 and the conductor layer 17.

The operation of the fourth embodiment shown in FIGS. 4(a)–4(c), which serves as a branching filter, will now be described. For example, a signal transmitted from a transmitter circuit is inputted to the transmitting filter 33 through the external terminal 38 and the input terminal 35 of the transmitting filter 33 connected to the external terminal 38. When the transmitted signal is inputted to the transmitting filter 33, the transmitting filter 33 effects a filtering process on the transmitted signal based on its filter characteristics and outputs the so-processed signal to the output terminal 34 of the transmitting filter 33. The output signal passes through the line 31 and the strip line 22 so as to be sent to the outer terminal 21. An antenna (not shown) is normally connected to the external terminal 21 and the transmitting signal is radiated into the space through the antenna.

Further, a signal to be received, which is transmitted from an outer communication apparatus or the like, is inputted to the external terminal 21 through the unillustrated antenna or the like. Thereafter, the signal passes through the end 25 of the strip line 23 and the line 32 so as to be inputted to the input terminal 44 of the receiving filter 43. The received signal, which has been subjected to a filtering process of the receiving filter 43, is inputted to and amplified by the low-noise amplifier 71. Further, the amplified signal is inputted to the receiving interstage filter 72 so as to be sent to the external terminal 48.

According to the present embodiment as described above, since the two-branch strip line 20 comprised of the external terminal 21 and the two strip lines 22 and 23 is constructed so as to be interposed between the conductor layer 17 and the conductor substrate 15 (both of which serve as earth electrodes), the two-branch strip line 20 can ensure a stable line impedance and is hard to be susceptible to external noise. Thus, desired wiring patterns can be patterned on the dielectric layer 16 and the low-noise amplifier 71 and the interstage filter 72 or the like can be easily disposed. It is therefore possible to realize a branching filter module which is extremely small in size. It is apparent that the elements to be disposed are not necessarily limited to the low-noise amplifier 71 and the interstage filter 72.

A fifth embodiment according to the present invention will now be described with reference to FIGS. 5(a) and 5(b). In a manner similar to the fourth embodiment of FIGS. 4(a)–4(c), the present embodiment shows the case where the broken line block B in the block diagram circuit arrangement of the high-frequency section of the mobile radio apparatus shown in FIG. 7, is realized as a branching filter module. In the present embodiment, transmitting and receiving filters used for a branching filter are stored within a single package, for example and circuit elements such as a low-noise amplifier 110, an interstage filter 111 and the like are disposed.

Figure 5A:
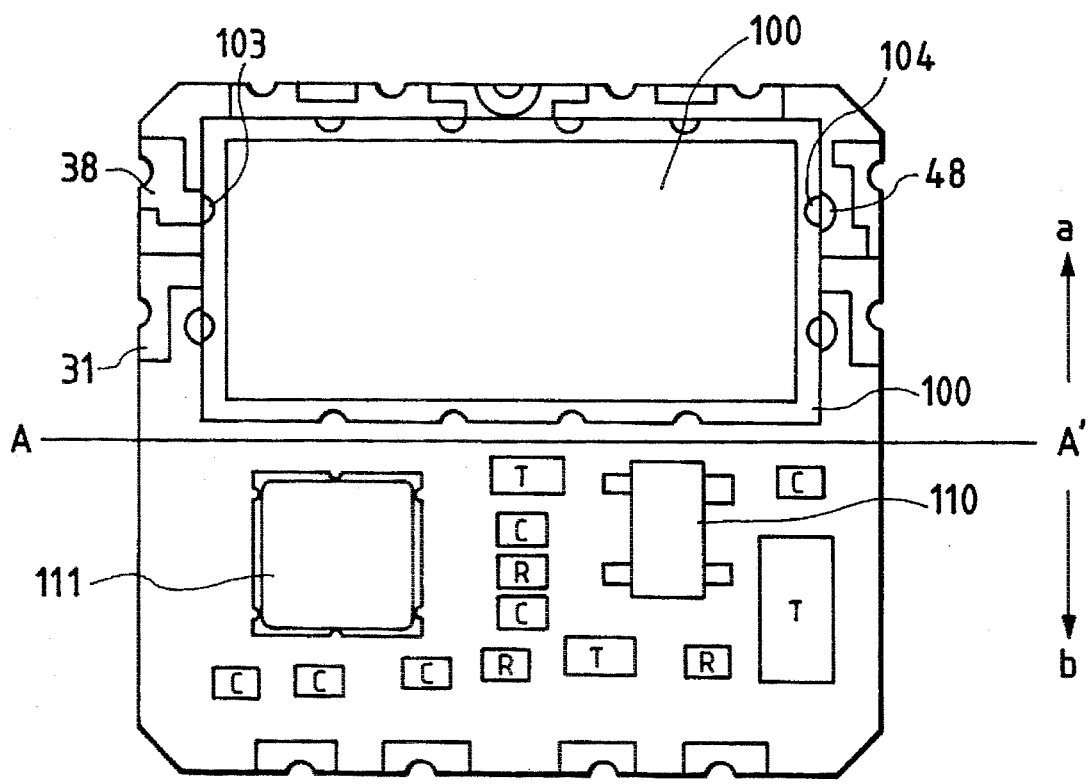
FIGS. 5(a) and 5(b) are views illustrating the structure of a still further embodiment according to the present invention.

FIG. 5(a) is a top view showing the state of a structure of the present embodiment as seen from above. FIG. 5(b) is a partially sectional enlarged view for describing the structure of a multilayer dielectric 1 employed in the present embodiment. The present embodiment makes use of the multilayer dielectric 1 having a laminated structure substantially identical to that of the second embodiment shown in FIGS. 2(a)–2(d). Namely, the multilayer dielectric 1 is constructed such that a dielectric layer 14 is fabricated on a conductor substrate 15 and a dielectric layer 12 is formed on the dielectric layer 14. At this time, the patterns such as the two-branch strip line 20, etc. shown in FIG. 1(c) are provided on the dielectric layer 14. A portion on which the patterns such as the two-branch strip line 20, etc. are provided, will be referred to as a conductor layer 13 for convenience of illustration and description. Devices such as a transmitting and receiving filter 100, etc. are fabricated on the dielectric layer 12 as shown in FIG. 5(a). A portion on which the devices such as the transmitting and receiving filter, etc. are provided, will be referred to as a conductor layer 11. An organic material such as a glass-cloth base epoxy resin or the like is used as the dielectric layer and copper is considered as a material of a conductor to be used.

The manner of disposing the two-branch strip line on the dielectric layer 14, which is employed in the present embodiment is different from that employed in each of the aforementioned embodiments. Thus, the present embodiment can bring about a novel advantageous effect. The manner of disposing the two-branch strip line on the dielectric layer 14, which is employed in the present embodiment, is similarly used even in the case of later described embodiments.

As shown in FIG. 5(a), a cutting plane line is taken as AA'. In the drawing, a portion as seen in an upper direction from the cutting plane line AA' and a portion as seen in a lower direction from the cutting plane line AA' will be called a and b sides respectively for convenience of illustration and description. As is seen from FIG. 5(a), a transmitting and receiving filter 100 is disposed on the a side whereas, a low-noise amplifier 110, an interstage filter 111, a surface-mounting type resistor R, a capacitor C, a coil T, etc. are provided on the b side.

The two-branch strip line is provided on the dielectric layer 14. However, the two-branch strip line is constructed so as to be disposed on the a side as shown in FIG. 5(a) when the branching filter module is seen from above. Thus, surface areas of the conductor substrate 15 and the dielectric layer 14 increase as compared with the aforementioned embodiments. Now, conductor parts provided on the conductor substrate 15 and the dielectric layer 12 are disposed so as to ensure a closed structure of the two-branch strip line. Since the two-branch strip line is provided in this manner, necessary circuits and the like can be disposed on the b side without taking into consideration the ensuring of the closed structure. It is thus possible to increase the degree of freedom of laying out the necessary circuits and the like.

Although wiring patterns for electrically connecting the low-noise amplifier 110, the interstage filter 111, the surface-mounting type resistor R, the capacitor C, the coil T, etc. to one another and wiring patterns for connecting between circuit elements are not shown in the drawing, a circuit system which is substantially insusceptible to external noise can be constructed by providing the dielectric layers 11 and 12 of the multilayer dielectric 1 and through holes. Thus, this type of circuit system is advantageous even to a reduction in size.

Further, a noise factor and other circuit performance (e.g., a reduction in transmission loss at a high-frequency band) can be improved by using a high-frequency low-loss substrate as the multilayer dielectric 1. Since, however, the area of the multilayer dielectric 1 is narrower than that of a conventional one even when such an expensive high-frequency low-loss substrate is used, the use of the high-frequency low-loss substrate can provide excellent economy.

The present embodiment shows the case where a plurality of surface-mounting type coils T are provided. However, these coils T can be replaced by spiral flat coils, for example. In this case, a further reduction in noise produced in the circuit system and size thereof can be realized by disposing the spiral flat coils in an internal layer of a multilayer dielectric substrate 1, for example, i.e., on the remaining space (corresponding to the b side of FIG. 5(a) as seen from above) which exists on the dielectric layer 14 and in which the two-branch strip line is disposed.

Figure 8:
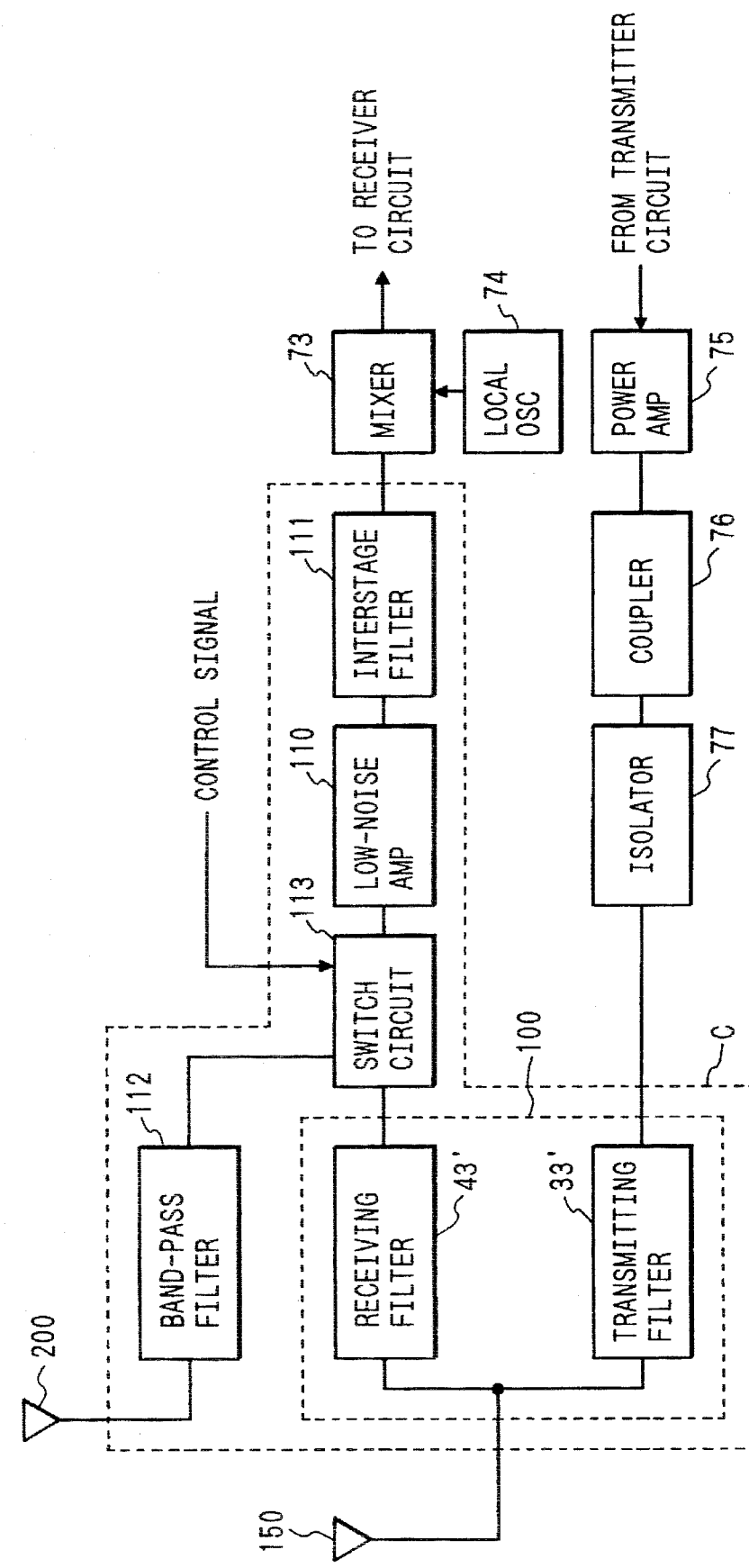
FIG. 8 is a block diagram circuit arrangement of another high-frequency section of a mobile radio apparatus.

A sixth embodiment will now be described with reference to FIGS. 6(a) and 6(b) and FIG. 8. FIG. 8 is a block diagram circuit arrangement of a high-frequency section of a mobile radio apparatus provided with a diversity receiving antenna and a band-pass filter. The present embodiment shows the case the broken line block C in FIG. 8 is used as a branching filter module. In the present embodiment, however, transmitting and receiving filters for a branching filter are accommodated within a single package, for example and circuits such as a low-noise amplifier, etc. are separately disposed.

The mobile radio apparatus shown in FIG. 8 provides diversity of a system wherein a plurality of receiving antennas are situated in spatially separated positions and an antenna capable of providing a high received-signal level is selectively used as a receiving antenna. In FIG. 8, a reception-only antenna 200 and a transmitting and receiving antenna 150 are used. Referring to FIG. 8, a signal received by the antenna 150 is subjected to a filtering process in the receiving filter 43'. That is, the level of a signal, which lies outside of a necessary frequency band, is reduced or attenuated by the receiving filter and the attenuated signal level is inputted to a selector or switcher 113 for selecting a desired antenna. On the other hand, a signal received by the antenna 200 is also subjected to a filtering process in a band-pass filter 112. Namely, the level of a signal, which lies outside of a necessary frequency band, is attenuated by the band-pass filter 112 and the attenuated signal level is inputted to the switcher 113. Thereafter, an unillustrated receiver circuit generates a control signal for selecting an antenna capable of providing a high received-signal level. The switcher selects either one of the antennas in response to the control signal. The signal received by the selected antenna is subsequently used. Such a selection may be performed for each predetermined time.

The received signal is amplified by the low-noise amplifier 71 comprised of semiconductor amplifying elements such as an HEMT, an FET, etc. and passive circuit parts for driving these semiconductor amplifying elements. Thereafter, the level of the signal, which lies outside of the necessary frequency band, is attenuated again by an interstage filter 111, followed by inputting to a mixer 73. The mixer is also supplied with a signal outputted from a local oscillator 74 and the output of the mixer becomes an intermediate frequency signal, after which it is inputted to an unillustrated subsequent-stage receiver circuit.

On the other hand, a signal transmitted from an unillustrated transmitter circuit is amplified by a power amplifier 75 comprised of semiconductor amplifying elements such as an FET, etc. and passive circuit parts for driving these semiconductor amplifying elements. Thereafter, the amplified signal is supplied to the antenna 150 through a coupler 76, an isolator 77 and a transmitting filter 33 so as to be transmitted through the antenna 150. The coupler is comprised of a microstrip line and passive circuit parts and is used to detect the level of a transmitting signal. However, the coupler is not always an essential component. The isolator is made up of ferrite and serves as a device having a function of transmitting a signal in one direction. However, this isolator is not always an essential component either.

Figure 5B:
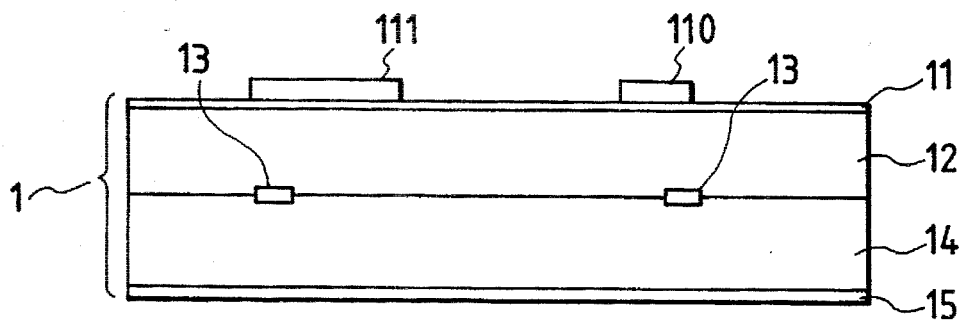
Figure 6A:
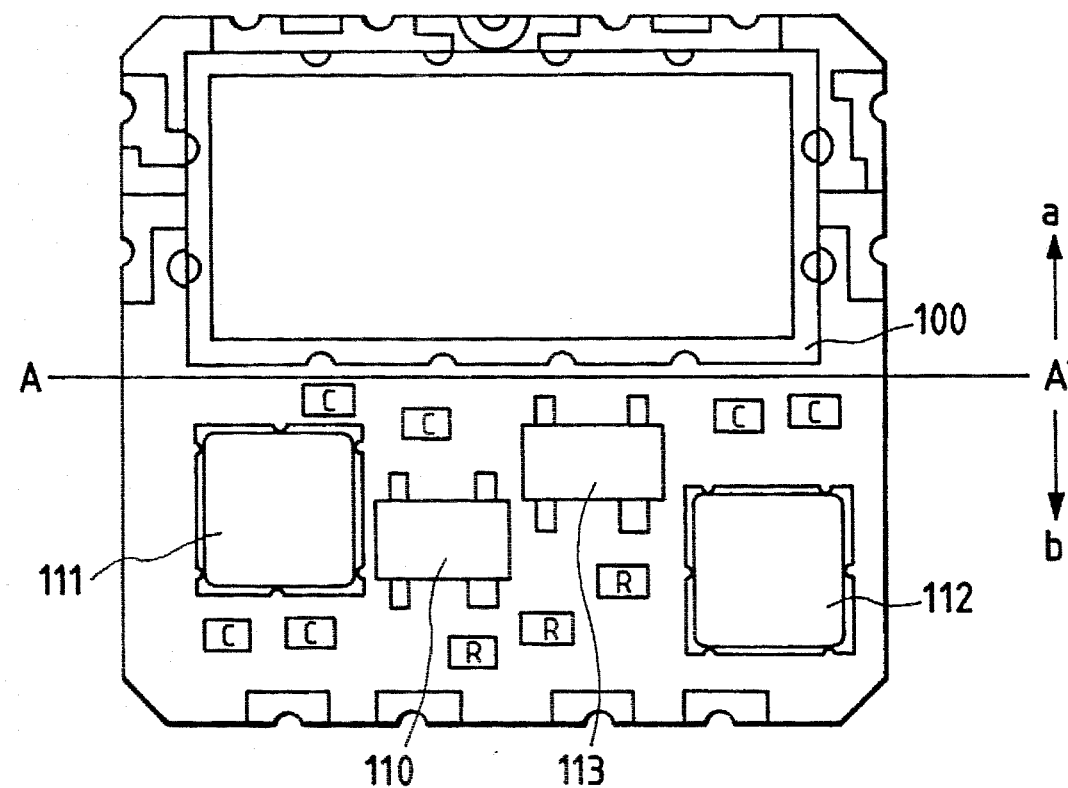
FIGS. 6(a) and 6(b) are views showing the structure of a still further embodiment according to the present invention.
Figure 6B:
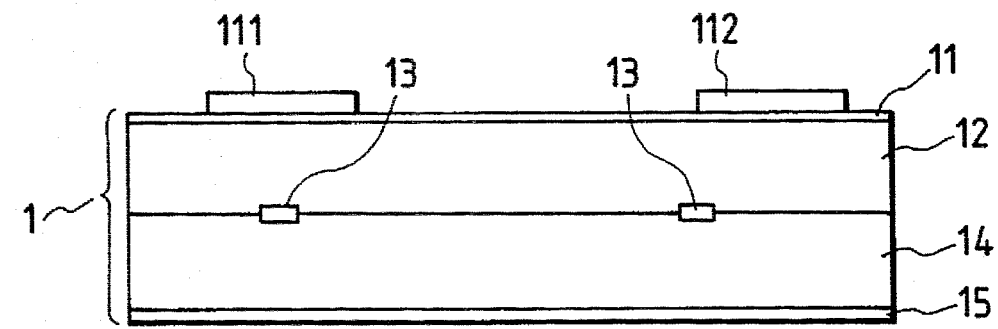

FIG. 6(a) is a top plan view showing the state of a structure of the present embodiment as seen from above. FIG. 6(b) is a partial sectional enlarged view showing the structure of a multilayer dielectric 1 employed in the present embodiment and makes use of the multilayer dielectric substrate 1 stacked in a configuration similar to that employed in the fifth embodiment shown in FIGS. 5(a) and 5(b). Namely, the multilayer dielectric 1 is constructed such that a dielectric layer 14 is fabricated on a conductor substrate 15 and a dielectric layer 12 is formed on the dielectric layer 14. At this time, the patterns such as the two-branch strip line 20, etc. shown in FIG. 1(c) are provided on the dielectric layer 14. A portion on which the patterns such as the two-branch strip line 20, etc. are provided, will be referred to as a conductor layer 13 for convenience of illustration and described.

The devices such as the transmitting and receiving filter 100, etc. shown in FIG. 5(a) are fabricated on the dielectric layer 12. A portion on which the devices such as the transmitting and receiving filter, etc. are provided, will be referred to as a conductor layer 11 for convenience of illustration and description. A glass organic material such as a glass-cloth base epoxy resin or the like is used as the dielectric layer and copper is considered as a material of a conductor to be used.

The manner of disposing the two-branch strip line on the dielectric layer 14, which is employed in the present embodiment, is identical to that employed in the fifth embodiment of FIGS. 5(a) and 5(b). Namely, now considering that a cutting plane line is taken as AA' as shown in FIG. 6(a), and a portion as seen in an upper direction from the cutting plane line AA' and a portion as seen in a lower direction from the cutting plane line AA' will be referred to as sides a and b, respectively, in the drawing. In this case, the two-branch strip line is provided on the dielectric layer 14. However, the two-branch strip line is constructed so as to be disposed on the a side as shown in FIG. 6(a) when the branching filter module is seen from above.

In FIG. 6(a), a transmitting and receiving filter 100 is provided on the a side on the dielectric layer 12, whereas the low-noise amplifier 110, the interstage filter 111, the band-pass filter 112, the switcher 113 and circuit elements such as a surface-mounting type resistor R, a capacitor C, etc. are provided on the b side. Of course, a conductor plate for ensuring a closed structure is disposed on the a side so that the impedance of the two-branch strip line is stabilized.

Figure 9:
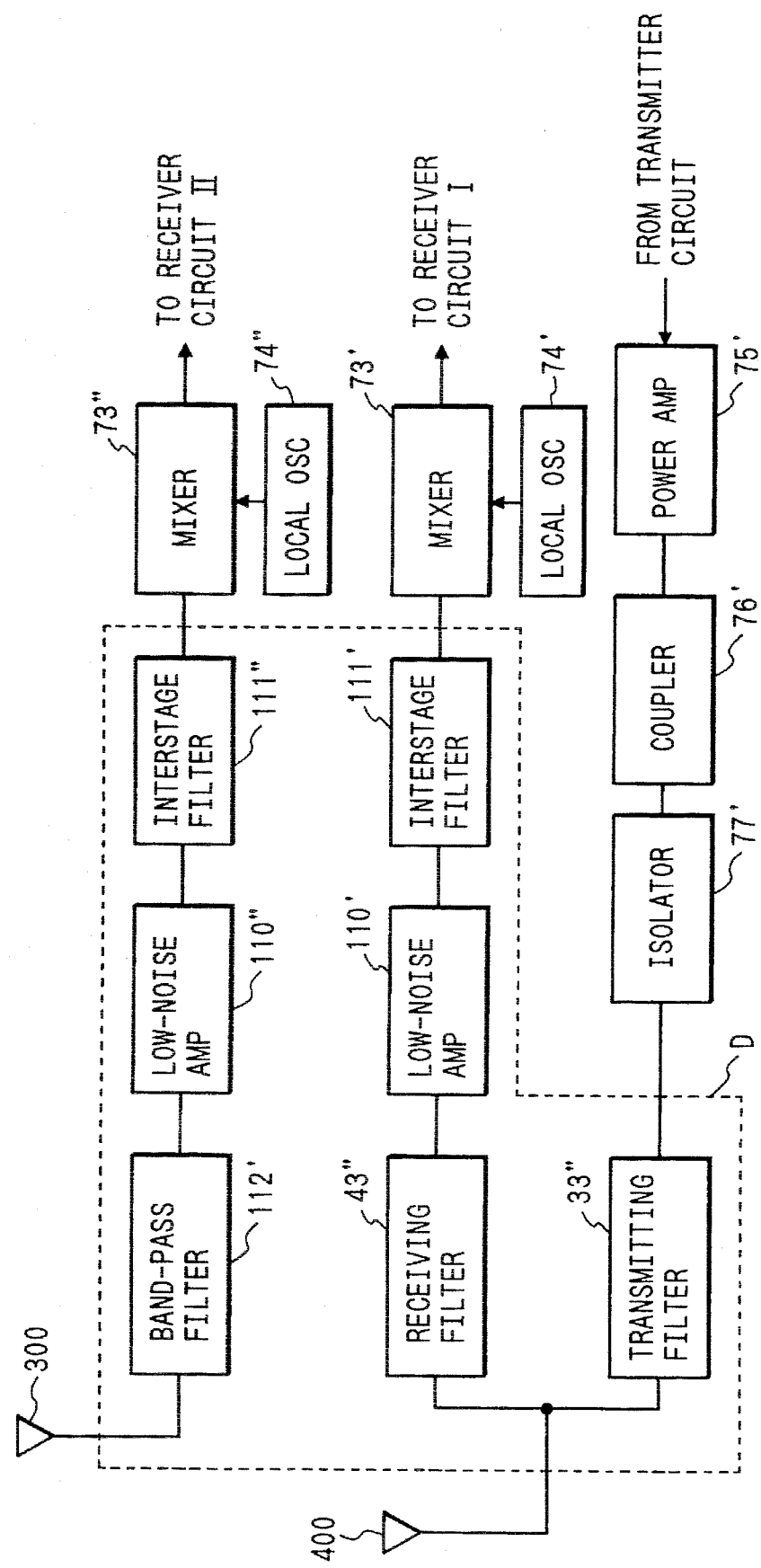
FIG. 9 is a block diagram circuit arrangement of a further high-frequency section of a mobile radio apparatus.

Further, necessary coil elements may be disposed in an internal layer of the multilayer dielectric 1 (on the b side of the dielectric layer 14, for example) as spiral flat coils. Although wiring patterns for connecting between these elements and wiring patterns for connecting between the transmitting and receiving filter 100, the low-noise amplifier 110, the switcher 113 and the circuit elements are not shown in the drawing, desired electrical connections between them are made using via holes defined in the respective layers of the stacked multilayer dielectric 1. The present embodiment has the same advantageous effect as that obtained in the fifth embodiment of FIGS. 5(a) and 5(b) and is suitable for a size reduction in the mobile radio apparatus having the diversity receiving function.

Where receiver circuits of two systems are used as shown in FIG. 9 which is a block diagram of a circuit arrangement of a high-frequency section of a mobile radio apparatus having a diversity receiving function, a portion indicated by broken line block D in FIG. 9 can be realized as a branching filter module. Therefore, the present embodiment is also suitable for a size reduction in such a radio apparatus.

In FIG. 9, a signal received by an antenna 400 is subjected to a filtering process in a receiving filter 43". That is, the level of a signal, which lies outside a necessary frequency band, is reduced or attenuated by the receiving filter. Further, the attenuated signal is amplified by a low-noise amplifier 110' comprised of semiconductor amplifying elements such as an HEMT, an FET, etc. and passive circuit parts for driving these semiconductor amplifying elements. Thereafter, the level of the signal, which lies outside the necessary frequency band, is attenuated again by an interstage filter 111' followed by inputting to a mixer 73'. The mixer is also supplied with a signal outputted from a local oscillator 74' and the output of the mixer becomes an intermediate frequency signal after which it is inputted to an unillustrated subsequent-stage receiver circuit I. Similarly, a signal received by an antenna 300 is also subjected to a filtering process in a band-pass filter 112'. Namely, the level of a signal, which lies outside a necessary frequency band, is attenuated by the band-pass filter. Further, the attenuated signal level amplified by a low-noise amplifier 110" comprised of semiconductor amplifying elements such as an HEMT, an FET, etc. and passive circuit parts for driving these semiconductor amplifying elements. Thereafter, the level of the signal, which lies outside of the necessary frequency band, is attenuated again by an interstage filter 111" followed by inputting to a mixer 73". The mixer is also supplied with a signal outputted from a local oscillator 74" and the output of the mixer becomes an intermediate frequency signal after which it is inputted to an unillustrated subsequent-stage receiver circuit II. Either one of the signals received by the antennas 300 and 400 is selected by an unillustrated switcher electrically connected to a subsequent stage to thereby realize a diversity function.

On the other hand, a signal transmitted from an unillustrated transmitter circuit is amplified by a power amplifier 75' comprised of semiconductor amplifying elements such as an FET, etc. and passive circuit parts for driving these semiconductor amplifying elements. Thereafter, the amplified signal is supplied to the antenna 400 through a coupler 76', an isolator 77' and a transmitting filter 33' so as to be transmitted through the antenna 400. The coupler is comprised of a microstrip line and passive circuit parts and is used to detect the level of the transmitting signal. However, the coupler is not always an essential component. The isolator is made up of ferrite and serves as a device having a function of transmitting a signal in one direction. However, this isolator is not always an essential component either.

A seventh embodiment according to the present invention will now be described with reference to FIGS. 10(*a*) and 10(*b*). Similarly to the sixth embodiment of FIGS. 6(*a*) and 6(*b*), the present embodiment shows the case where the broken line block C in FIG. 8 is used as the branching filter module. In the present embodiment, however, transmitting and receiving filters for a branching filter are accommodated within a single package 100 and circuit elements or the like are disposed in a separate manner. In this case, however, chip-like amplifying elements (such as a paired chip for IC), which are not included in the package, are used to realize an amplifying function.

Figure 10A:
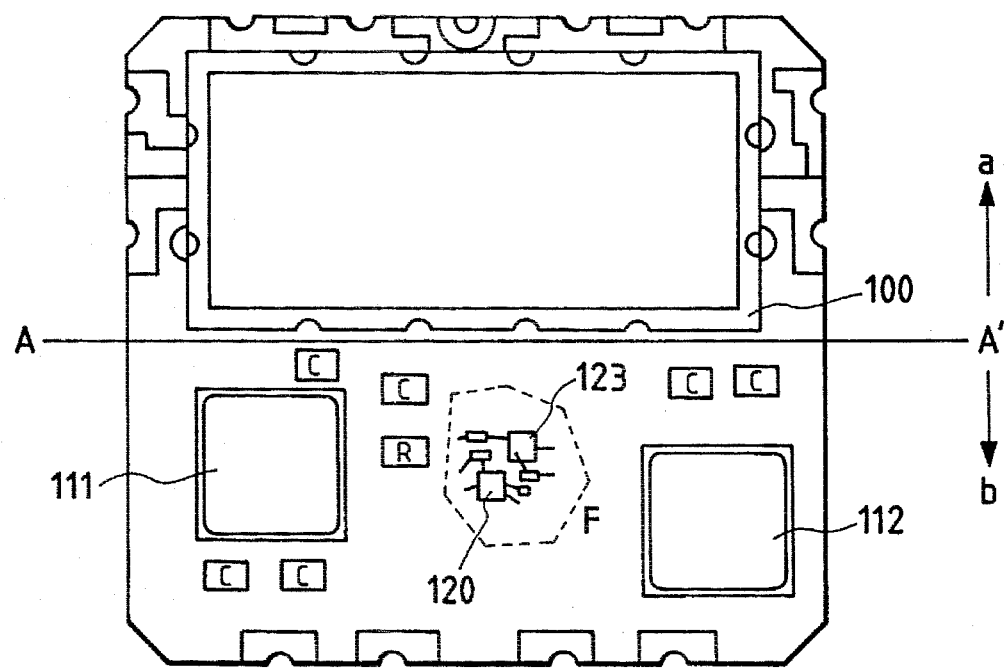
FIGS. 10(a) and 10(b) are views illustrating a still further embodiment according to the present invention.
Figure 10B:
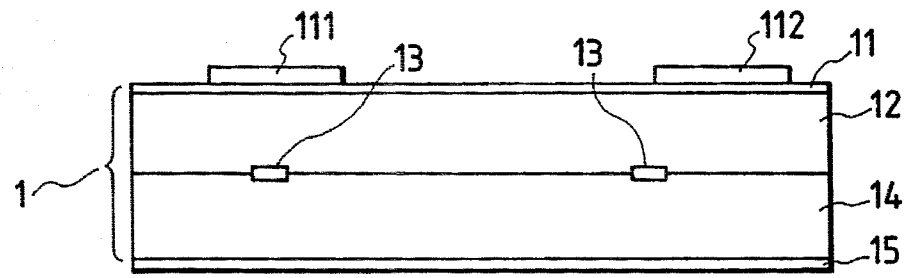
Figure 11:
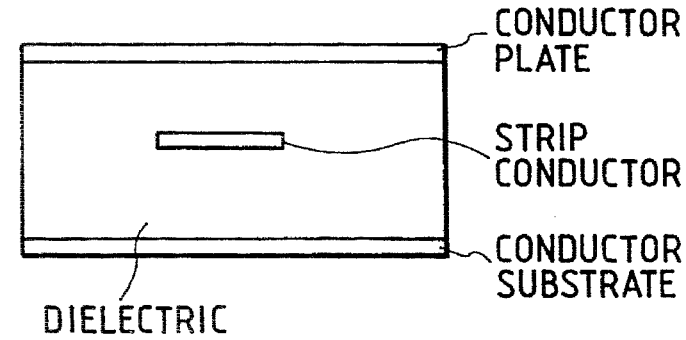
FIG. 11 is a view illustrating a closed structure of a strip line.

FIG. 10(*a*) is a top view showing the manner of a structure of the present embodiment as seen from above. FIG. 10(*b*) is a partial sectional enlarged view illustrating the structure of a multilayer dielectric 1 employed in the present embodiment. Namely, the multilayer dielectric 1 is constructed such that a dielectric layer 14 is fabricated on a conductor substrate 15 and a dielectric layer 12 is formed on the dielectric layer 14. At this time, the patterns such as the two-branch strip line 20, etc. shown in FIG. 1(*c*) by way of example, are provided on the dielectric layer 14. A portion on which the patterns such as the two-branch strip line 20, etc. are provided, will be referred to as a conductor layer 13 for convenience of illustration and description. Devices such as a transmitting and receiving filter 100, etc. shown in FIG. 10(*a*) are provided on the dielectric layer 12. A portion on which the devices such as the transmitting and receiving filter, etc. are provided; will be referred to as a conductor layer 11 for convenience of illustration and description. An organic material such as a glass-cloth base epoxy resin or the like is used as the dielectric layer and copper is considered as a material of a conductor to be used.

The manner of disposing the two-branch strip line on the dielectric layer 14, which is employed in the present embodiment, is identical to that employed in the fifth embodiment of FIGS. 5(*a*) and 5(*b*). Namely, considering that a cutting plane line is taken as AA' as shown in FIG. 10(*a*) and a portion as seen in an upper direction from the cutting plane line AA' and a portion as seen in a lower direction from the cutting plane line AA' will be referred to as sides a and b in the drawing, respectively. In this case, the two-branch strip line is provided on the dielectric layer 14. However, the two-branch strip line is constructed so as to be disposed on the a side as shown in FIG. 10(*a*) when a branching filter module is seen from above.

In FIG. 10(*a*), the transmitting and receiving filter 100 is provided on the a side on the dielectric layer 12, whereas an amplifying element 120, an interstage filter 111, a band-pass filter 112, a switcher 113 and circuit elements such as a surface-mounting type resistor R, a capacitor C, etc. are provided on the b side. Of course, a conductor plate for ensuring a closed structure is disposed on the a side so that the impedance of the two-branch strip line is stabilized.

Further, necessary coil elements may be disposed in an internal layer of the multilayer dielectric 1 (on the b side of the dielectric layer 14, for example) as spiral flat coils. Although wiring patterns for connecting between these elements and wiring patterns for connecting between the transmitting and receiving filter 100, a low-noise amplifier 110, a switcher 113 and circuit elements are not shown in the drawing, desired electrical connections between them are made using via holes defined in the respective layers of the stacked multilayer dielectric 1.

A chip-like amplifying element 120, a switcher 123 and printing resistance circuit elements and the like, which are not packed into a package, are disposed and sealed within an area indicated by a dot line F in FIG. 10(*a*). The elements, which exist within the area indicated by the dot line F in FIG. 10(*a*), are electrically connected to one another by bonding wires. Since such a construction permits high-density mounting, the module can be further reduced in size. Further, since the multilayer dielectric 1 is used, the capacitor C can be fabricated on each dielectric layer by a wiring pattern. This can reduce the number of external parts and enables a reduction in size and improvements in workability and economy.

According to the present invention as has been described above, different parts can be mounted on an outer layer (e.g., an upper surface of a dielectric layer, which is situated in an upper layer) by providing a two-branch strip line at an intermediate position of a dielectric substrate comprised of a plurality of layers. Further, since a surface-wave filter, which does not need a matching circuit, is used, a branching filter is advantageous to its size reduction.

Since the length of the two-branch strip line can be reduced to a length corresponding to about half of normal length, a branching filter is advantageous to its further size reduction. It is therefore possible to easily realize the small-sized branching filter or branching filter module. Further, an amplifying circuit, other filter (interstage filter), other circuit elements, etc. can be easily constructed in combination. In this case, parts of the circuit elements can also be disposed in an intermediate position of a dielectric substrate. It is therefore possible to form a circuit system which is less affected by external noise, high in performance and small in size. Moreover, since the surface area of a dielectric layer employed in the present invention is narrower than that of a conventional dielectric layer, a branching filter module, which is inexpensive and provides less loss, can be constructed even if an expensive and high-frequency high-performance substrate is used. If this type of branching filter module or branching filter is used, then different radio apparatus can be realized which are extremely small in size.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

We claim:

1. A high-frequency apparatus comprising:

a conductor substrate;

a first dielectric layer provided on said conductor substrate;

a strip conductor provided on said first dielectric layer;

a second dielectric layer provided on said strip conductor and having through holes provided therein; and at least one elastic surface-wave element provided over said second dielectric layer in a position above said strip conductor and connected to said strip conductor by said through holes.

2. A high-frequency apparatus according to claim 1, further comprising a conductor member forming a strip line provided on said second dielectric layer and located in a position above said strip conductor, said at least one elastic surface-wave element being connected to said strip line and being connected to said strip conductor by said strip line and said through holes.

3. A high-frequency apparatus according to claim 1, wherein at least a portion of said at least one elastic surface-wave element is directly provided on at least a portion of said second dielectric layer.

4. A high-frequency apparatus according to claim 1, wherein said high-frequency apparatus is a branching filter, said strip conductor being a two-branch strip line conductor having transmitting and receiving terminals to which devices including an antenna are connectable, said at least one elastic surface-wave element including transmitting and receiving elastic surface-wave filters provided on the second dielectric layer and above said two-branch strip line conductor so as to be connected to branches of said two-branch strip line conductor through said through holes, respectively.

5. A high-frequency apparatus according to claim 4, wherein respective conductor members forming first and second strip lines are provided on said second dielectric layer and located in a position above said two-branch strip line conductor, one of said first and second strip lines being connected to said transmitting elastic surface-wave filter and the other of said first and second strip lines being connected to said receiving elastic surface-wave filter, said transmitting and receiving elastic surface-wave filters being connected to respective ones of said branches of said two-branch strip-line conductor by said first and second strip lines and said through holes.

6. A high-frequency apparatus according to claim 4, wherein said second dielectric layer has a terminal for inputting a transmitting signal received by said transmitting elastic surface-wave filter, a terminal for outputting a filtering signal from said transmitting elastic surface-wave filter, a terminal for inputting a transmitting signal received by said receiving elastic surface-wave filter and a terminal for outputting a filtering signal from said receiving elastic surface-wave filter, each of said terminals being provided on said second dielectric layer.

7. A high-frequency apparatus according to claim 6, wherein each of said transmitting and receiving elastic surface-wave filters includes a plurality of elastic surface-wave resonators formed on a piezoelectric substrate and spiral coils formed on a substrate different from the piezoelectric substrate, said elastic surface-wave resonators being respectively electrically connected to said spiral coils.

8. A high-frequency apparatus according to claim 4, wherein at least one circuit including a matching circuit, an amplifying circuit and an interstage filter is provided on said second dielectric layer so as to be connected to at least one terminal of said at least one elastic surface-wave element.

9. A high-frequency apparatus according to claim 4, wherein said high-frequency apparatus is a branching filter module including said branching filter therein, said branching filter module further including at least one circuit including a matching circuit, an amplifying circuit and an interstage filter provided on said second dielectric layer in a space other than a space above a space in which said two-branch strip line conductor provided on said first-dielectric layer is disposed, said at least one circuit being connected to at least one terminal of said at least one elastic surface-wave element.

10. A high-frequency apparatus according to claim 6, wherein said high-frequency apparatus is a branching filter module including said branching filter therein, said branching filter module further including at least one circuit including a matching circuit, an amplifying circuit and an interstage filter provided on said second dielectric layer in a space other than a space above a space in which said two-branch strip line conductor provided on said first dielectric layer is disposed, said at least one circuit being connected to at least one terminal of said at least one elastic surface-wave filter, and at least any component forming said at least one circuit is connected to at least one terminal of said at least one elastic surface-wave element by said through holes.

11. A high-frequency apparatus according to claim 4, wherein said high-frequency apparatus is a radio communication apparatus including said branching filter therein, and further comprising an antenna connected to said transmitting and receiving terminals, a transmitter circuit for transmitting a transmitting signal to an input terminal of said transmitting elastic surface-wave filter, and a receiver circuit for electrically processing a received signal produced from an output terminal of said receiving elastic surface-wave filter.

12. A high-frequency apparatus according to claim 4, further comprising a band-pass filter, an output of said band-pass filter and an output of said receiving elastic surface-wave filter being supplied to a switching circuit, said switching circuit being responsive to a control signal for selecting and providing one of the output of said band-pass filter and said receiving elastic surface-wave filter to an interstage filter through a low-noise amplifier.

13. A high-frequency apparatus according to claim 12, wherein said high-frequency apparatus is a branching filter module including said branching filter therein and having said switching circuit, said low-noise amplifier and said interstage filter provided on said second dielectric layer.

14. A high-frequency apparatus according to claim 13, wherein said high-frequency apparatus is a radio communication apparatus including said branching filter module therein, further comprising a first antenna connected to said transmitting and receiving elastic surface-wave filters and a second antenna connected to said band-pass filter.

15. A high-frequency apparatus according to claim 4, further comprising a band-pass filter providing an output to a first interstage therein through a first low-noise amplifier, said receiving elastic surface-wave filter providing an output to a second interstage filter through a second low-noise amplifier.

16. A high-frequency apparatus according to claim 15, wherein said high-frequency apparatus is a branching filter module including said branching filter therein and having said band-pass filter, said first and second low-noise amplifiers and said first and second interstage filters provided on said dielectric layer.

17. A high-frequency apparatus according to claim 15, wherein said high-frequency apparatus is a radio communication apparatus including said branching filter module therein, and further comprising a first antenna connected to said transmitting and receiving elastic surface-wave filters and a second antenna connected to said band-pass filter.

18. A high-frequency apparatus according to claim 4, further comprising an open stub provided on said first dielectric layer in a space other than a space in which said two-branch strip line conductor is disposed, said open stub being connectable to said transmitting elastic surface-wave filter.

19. A high-frequency apparatus according to claim 4, further comprising a flat conductor plate provided on said second dielectric layer and a third dielectric layer provided on said flat conductor plate, said at least one elastic surface-wave element being provided on said third dielectric layer.

20. A high-frequency apparatus according to claim 1, further comprising a conductor member provided on said second dielectric layer without covering substantially the entire surface of said second dielectric layer.

21. A high-frequency apparatus according to claim 20, wherein the at least one elastic surface wave element is directly provided on at least a portion of said conductor member.

22. A high-frequency apparatus according to claim 20, wherein said strip conductor is located below said conductor member and sandwiched between said conductor member and said conductor substrate.

23. A high-frequency apparatus according to claim 20, wherein said at least one elastic surface wave element has at least a first portion directly provided on at least a portion of said conductor member and at least a second portion directly provided on at least a portion of said second dielectric layer.

* * * * *